United States Patent [19]

Palara

[11] 4,266,199
[45] May 5, 1981

[54] LINEAR ALTERNATING-CURRENT AMPLIFIER

[75] Inventor: Sergio Palara, Ferrara, Italy

[73] Assignee: SGS Ates Componenti Elettronici, S.P.A., Agrate Brianza, Italy

[21] Appl. No.: 33,502

[22] Filed: Apr. 26, 1979

[30] Foreign Application Priority Data

Apr. 28, 1978 [IT] Italy .............................. 22798 A/78

[51] Int. Cl.³ .............................................. H03F 3/30
[52] U.S. Cl. .................................................. 330/274
[58] Field of Search ............... 330/262, 265, 267, 268, 330/270, 273, 274

[56] References Cited

U.S. PATENT DOCUMENTS 3,904,974  9/1975  Fukata et al. ....................... 330/265

Primary Examiner—James B. Mullins

Attorney, Agent, or Firm—Karl F. Ross

[57] ABSTRACT

A linear alternating-current amplifier with push-pull-connected first and second output transistors $Q_1$, $Q_2$ includes a pilot transistor $Q_4$ and a control transistor $Q_3$ which drives the first output transistor $Q_1$ into saturation when the resistance of the pilot transistor $Q_4$ is high. The control transistor $Q_3$ has its base connected to the collector of the pilot transistor $Q_4$ and its emitter connected to the junction of the emitter of the first output transistor $Q_1$ with the collector of the second output transistor $Q_2$, the latter connection including a biasing resistor R in series with a constant-current generator G (or an equivalent resistor $R_G$ or fixedly biased transistor $Q_G$) which maintains the potential difference between the base and the emitter of the control transistor $Q_3$ at its conduction threshold during saturation of the pilot transistor $Q_4$ and the second output transistor $Q_2$.

6 Claims, 5 Drawing Figures

LINEAR ALTERNATING-CURRENT AMPLIFIER

FIELD OF THE INVENTION

My present invention relates to a linear alternating-current amplifier of the type having a final stage with two cascaded output transistors operating in class AB and driven in push-pull by a pilot transistor operating in class A.

BACKGROUND OF THE INVENTION

In an amplifier of this type, e.g. as disclosed in my copending application Ser. No. 024,077 filed Mar. 26, 1979, one of the transistors of the final stage (referred to hereinafter as the first output transistor) has an emitter forming a junction with a collector of the other transistor of that stage (referred to hereinafter as the second output transistor) whose emitter, like that of the associated pilot transistor, is connected to a usually grounded terminal of a direct-current supply having another terminal tied to the collector of the first output transistor. The latter terminal is also connected, via a diode energized in the forward direction and a constant-current source, to the collector of the pilot transistor and, via the forward resistance of another diode, to the collector of a control transistor whose base is connected to that constant-current source and whose emitter is tied to the aforementioned junction. The control transistor drives the first output transistor into maximal conduction when the resistance of the pilot transistor is high, i.e. during alternate half-cycles of an a-c input signal. When the pilot transistor saturates during the remaining half-cycles of that input signal, the second output transistor is also driven into saturation.

The current/voltage characteristic of such an a-c amplifier is nonlinear for load currents of a magnitude below a so-called quiescent current.

The first output transistor may be completely cut off or conduct at a level below its quiescent current during the operating half-cycles of the second output transistor, thus giving rise to a distortion of the load current at the beginning of its own operating cycle. This distortion, which involves the generation of higher harmonics liable to interfere with nearby high-frequency equipment, is due to the delaying effect of capacitances in the driving circuit of the first output transistor, e.g. the equivalent capacitance of a diode inserted in the base/emitter circuit of the control transistor. Such a diode, designed to stabilize the amplifier against spontaneous oscillations as needed especially in integrated circuitry, lies in parallel with the base/emitter path of the control transistor whose own equivalent capacitance is thus added to that of the diode.

OBJECT OF THE INVENTION

The object of my present invention, accordingly, is to provide means in such an a-c amplifier for suppressing the aforedescribed distortion.

SUMMARY OF THE INVENTION

I realize this object, in accordance with my present invention, by the provision of a biasing resistor inserted in the connection between the emitter of the control transistor and the junction of the cascaded output transistors, together with a source of direct current in series with that biasing resistor for maintaining the potential difference between the base and the emitter of the control transistor at the conduction theshold thereof during the alternate half-cycles in which the second output transistor is rendered operative.

This d-c source is advantageously a constant-current generator with a polarity opposite the flow of emitter current from the control transistor to the junction of the cascaded output transistors. Such a constant-current generator may be represented or approximated by an ancillary transistor with a fixed bias. A simple resistive connection between the biasing resistor and the grounded supply terminal, however, will be sufficient in some instances.

BRIEF DESCRIPTION OF THE DRAWING

The above and other features of my invention will now be described in detail with reference to the accompanying drawing in which.

SPECIFIC DESCRIPTION

Figure 3:
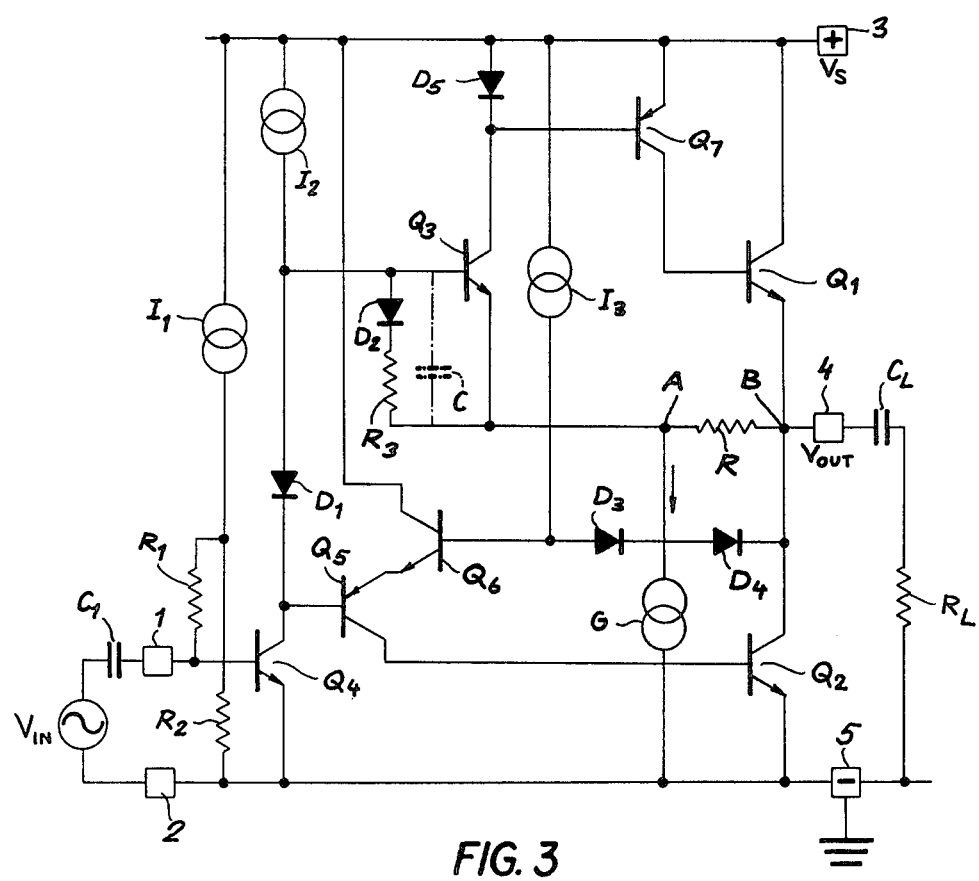
FIG. 3 is a circuit diagram of the pilot, intermediate and final stages of an amplifier embodying my present improvement.

In FIG. 3 I have shown an alternating-current amplifier whose final stage comprises two cascaded NPN transistors $Q_1$ and $Q_2$ inserted between a high-voltage terminal 3 and a ground terminal 5, the emitter of transistor $Q_1$ being tied to the collector of transistor $Q_2$ at a junction point B connected to an output terminal 4. A load shown to comprise a capacitor $C_L$ in series with a resistor $R_L$ lies between terminals 4 and 5. Transistors $Q_1$ and $Q_2$ are energized in push-pull, in response to an input signal $V_{in}$, with the aid of a pilot transistor $Q_4$, a control transistor $Q_3$ and two cascaded coupling transistors $Q_5$, $Q_6$ as well as a driving transistor $Q_7$. Pilot transistor $Q_4$, which is also of NPN type, has its base tied to an input terminal 1 which is coupled via a capacitor $C_1$ to the signal source $V_{in}$ having a grounded terminal 2; the emitter of transistor $Q_4$ is likewise grounded. The base of this transistor is biased by way of a resistor $R_1$ connected to a tap of a voltage divider lying between positive supply voltage $V_S$ and ground, this divider consisting of a constant-current generator $I_1$ in series with a resistor $R_2$. Another constant-current generator $I_2$ connected to supply terminal 3 lies in series with a diode $D_1$ inserted between the bases of NPN transistor $Q_3$ and PNP transistor $Q_5$. The latter transistor, whose collector is connected to the base of output transistor $Q_2$, has its emitter tied to that of NPN transistor $Q_6$ whose collector is directly connected to supply terminal 3. The collector of control transistor $Q_3$, tied to the base of PNP driving transistor $Q_7$, receives positive voltage from supply terminal 3 via the forward resistance of a diode $D_5$. Such voltage is also applied to the emitter of transistor $Q_7$ whose collector is connected to the base of output transistor $Q_1$. The base of transistor $Q_6$ is tied to a tap of a further voltage divider, consisting of a constant-current generator $I_3$ in series with diodes $D_3$ and $D_4$, inserted between terminal 3 and junction B. That junction is also connected to the emitter of control transistor $Q_3$ and, through a diode $D_2$ in series with a resistor $R_3$, to the base of that control transistor; circuit $D_2$, $R_3$ is shown shunted by a virtual capacitance C representing all the parasitic capacitances which lie between the base and the emitter of transistor $Q_3$.

In the system so far described, the load voltage $V_{out}$ on terminal 4 substantially follows the collector potential of pilot transistor $Q_4$. When transistors $Q_2$ and $Q_4$ both saturate during positive half-cycles of signal voltage $V_{in}$, the cathode of diode $D_1$ and the junction point B are at the same potential if the two transistors have the same collector/emitter voltage $V_{CEsat}$. With point B directly connected to the emitter of control transistor $Q_3$ in the conventional manner, the base/emitter potential $V_{BE}$ of transistor $Q_3$ would then correspond to the voltage drop across the forward resistance of biasing diode $D_1$ which, it is assumed, is so chosen as to maintain the transistor $Q_3$ at its conduction threshold while output transistor $Q_1$ is traversed by the aforementioned quiescent current throughout the operating half-cycle of its companion transistor $Q_2$. I have found, however, that the bias of transistor $Q_3$ does not remain constant during this half-cycle but that, owing to such circuit parameters as the base/emitter voltages of coupling transistors $Q_5$ and $Q_6$, the saturation voltage $V_{CEsat}$ of output transistor $Q_2$ is generally higher than that of pilot transistor $Q_4$ with resulting diminution of the base/emitter voltage $V_{out}$ of transistor $Q_3$. At the end of that half-cycle, when output transistor $Q_2$ returns to its quiescent state and the load voltage on terminal 4 rises to its median level, diode $D_1$ should be effective to render transistor $Q_3$ conductive; the restoration of the proper initial bias of the transistor base, however, is delayed by the parasitic capacitance C which includes the effective capacitance of diode $D_2$.

Figure 1:
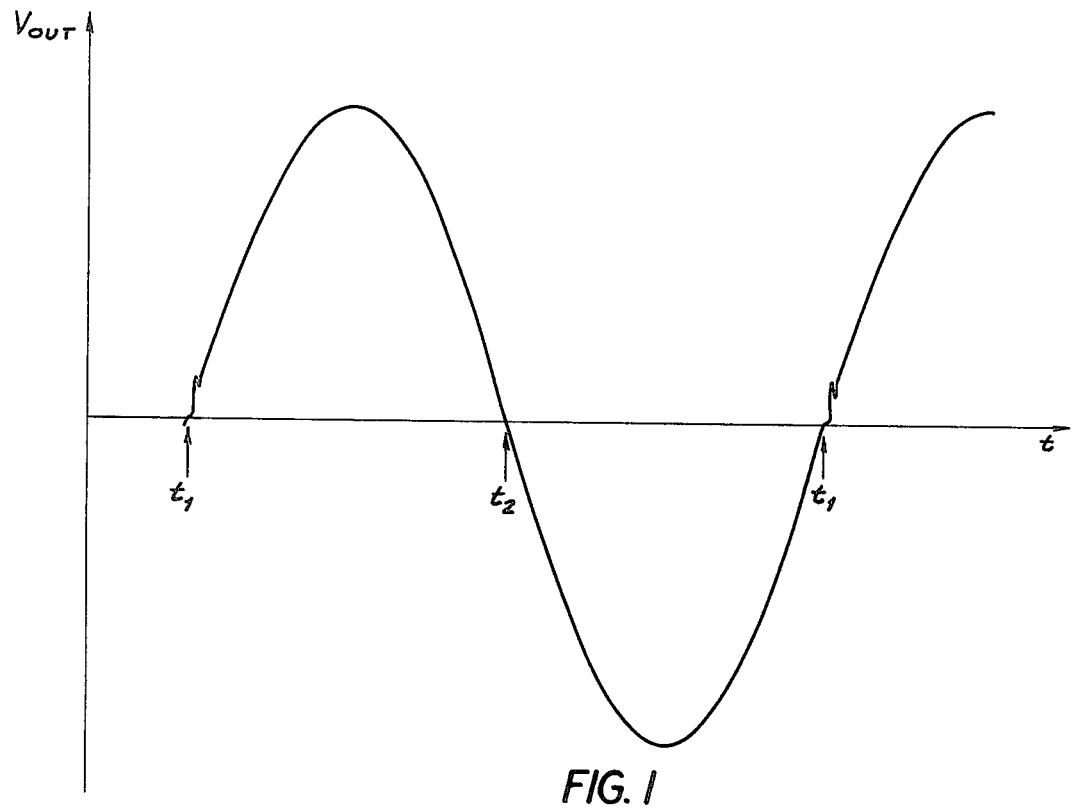
FIG. 1 is a graph showing a cycle of the load voltage produced by a conventional amplifier of the type here discussed.
Figure 2:
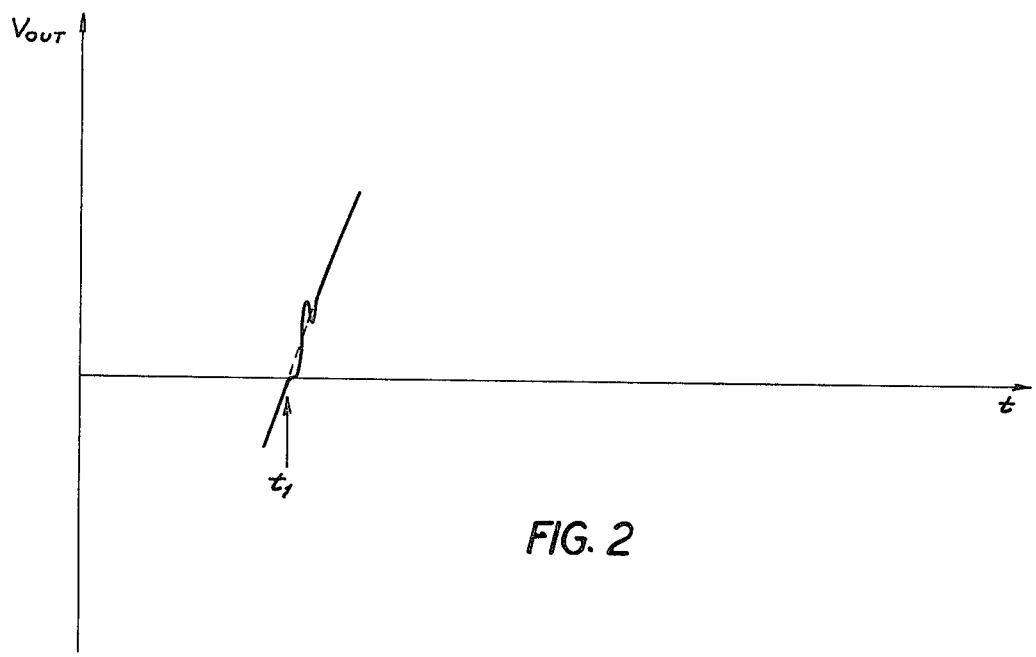
FIG. 2 is a similar graph showing an enlarged segment of the curve of FIG. 1.

Thus, as illustrated in FIG. 1, voltage $V_{out}$ does not rise sinusoidally at the beginning of the next half-cycle, starting at a time $t_1$, but undergoes some high-frequency oscillations as more clearly illustrated in full lines in FIG. 2; the next half cycle, beginning at a time $t_2$, is free from such fluctuations. With the polarities indicated in FIG. 3, load voltage $V_{out}$ goes positive during the operating half-cycle of transistor $Q_1$ and negative during the operating half-cycle of transistor $Q_2$.

Figure 4:
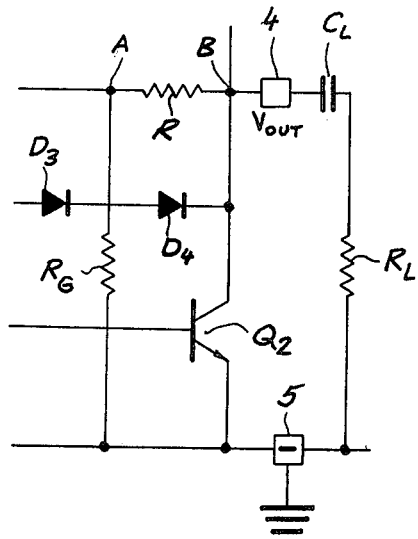
FIGS. 4 and 5 are partial circuit diagrams showing certain modifications in the amplifier of FIG. 3.
Figure 5:
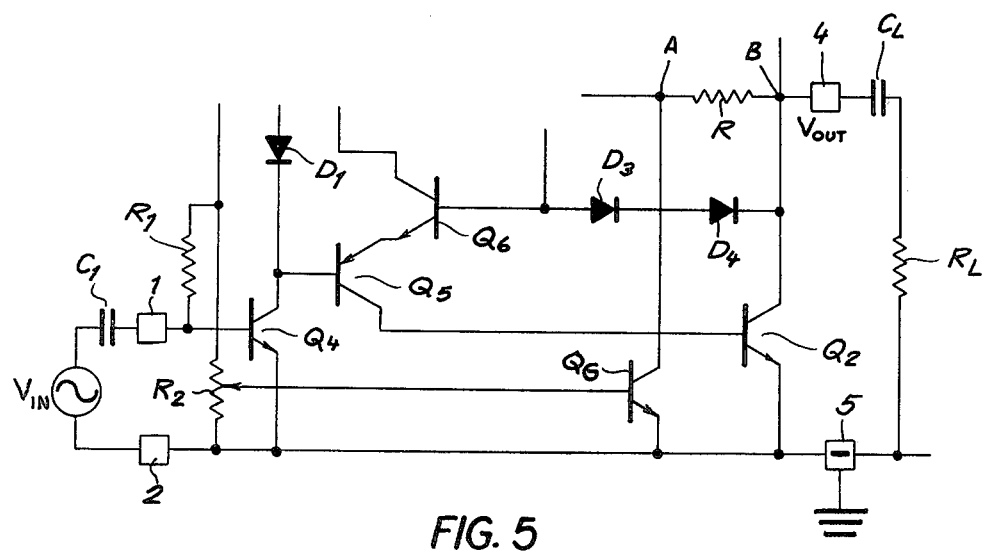

In order to suppress the oscillations shown in FIGS. 1 and 2, I have inserted in the amplifier of FIG. 3 a biasing resistor R lying between junction B and a point A on the emitter lead of control transistor $Q_3$. Resistor R is in series with a current source G which may be a constant-current generator similar to those shown in $I_1$–$I_3$. Such a current source may also take the form of a simple resistor $R_G$, connected between point A and ground as shown in FIG. 4, or may be a transistor $Q_G$ similarly inserted as shown in FIG. 5. The transistor $Q_G$ has its base connected to a tap of resistor $R_2$ but could also be independently biased by a fixed current source and a diode.

The magnitude of the current drawn by source G, whose direction has been indicated by an arrow in FIG. 3, is such as to bias the control transistor $Q_3$ to its conduction threshold during negative half-cycles of the load voltage $V_{out}$ shown in FIG. 1, i.e. between times $t_2$ and $t_1$. Output transistor $Q_1$, biased into limited conduction by the associated driving transistor $Q_7$ as long as transistor $Q_3$ is at the conduction threshold, will therefore become increasingly conductive at the start of the next positive half-cycle of voltage $V_{out}$ so that the undesired voltage fluctuations shown in FIGS. 1 and 2 do not occur. Generator G, resistor $R_G$ or transistor $Q_G$ may also be regarded as a shunt impedance connected across the series combination of resistor R and transistor $Q_2$.

I claim:

1. In a linear alternating-current amplifier including a supply of direct current with a first and a second terminal, a first output transistor and a second output transistor connected in cascade with each other across said supply, said first output transistor having an emitter which forms a junction with a collector of said second output transistor and further having a collector connected to said first terminal, said second output transistor having an emitter connected to said second terminal, a pilot transistor with an emitter connected to said second terminal and with a collector coupled to a base of said second output transistor for saturating simultaneously therewith during alternate half-cycles of an a-c input signal applied between the emitter and a base of said pilot transistor, said first terminal being connected to a collector of said pilot transistor by an energizing circuit including a constant-current source, and a control transistor with a collector connected to said first terminal, an emitter connected to said junction, and a base connected to said energizing circuit at a point between said constant-current source and the collector of said pilot transistor, said control transistor being coupled to said first output transistor for driving same into maximal conduction during the remaining half-cycles of said input signal, the combination therewith of a biasing resistor inserted in the connection between said junction and the emitter of said control transistor, and a shunt impedance connected across the series combination of said biasing resistor and said second output transistor for maintaining the potential difference between the base and the emitter of said control transistor at the conduction threshold thereof during said alternate half-cycles.

2. The combination defined in claim 1 wherein said energizing circuit further includes the forward resistance of a biasing diode inserted between said constant-current source and the collector of said pilot transistor, the base of said control transistor being connected to the last-mentioned collector through said biasing diode.

3. The combination defined in claim 1 or 2 wherein said shunt impedance is a constant-current generator with a polarity opposite the flow of emitter current from said control transistor to said junction.

4. The combination defined in claim 1 or 2 wherein said source comprises a resistive connection between said biasing resistor and said second terminal.

5. The combination defined in claim 1 or 2 wherein said shunt impedance comprises a fixedly biased ancillary transistor inserted between said biasing resistor and said second terminal.

6. The combination defined in claim 1 or 2, further comprising a conductive connection including the forward resistance of a diode between the base and the emitter of said control transistor.

* * * * *